(12) United States Patent
Shih

(10) Patent No.: US 11,605,596 B2
(45) Date of Patent: Mar. 14, 2023

(54) SEMICONDUCTOR DEVICE HAVING THROUGH SILICON VIAS

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 17/526,158

(22) Filed: Nov. 15, 2021

(65) Prior Publication Data

US 2022/0077071 A1 Mar. 10, 2022

Related U.S. Application Data

(62) Division of application No. 16/793,069, filed on Feb. 18, 2020, now Pat. No. 11,309,254.

(51) Int. Cl.
| | |
|---|---|
| *H01L 23/538* | (2006.01) |
| *H01L 23/00* | (2006.01) |
| *H01L 21/683* | (2006.01) |
| *H01L 21/48* | (2006.01) |
| *H01L 21/56* | (2006.01) |
| *H01L 23/31* | (2006.01) |

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 21/6835* (2013.01); *H01L 23/3128* (2013.01); *H01L 23/5383* (2013.01); *H01L 23/5384* (2013.01); *H01L 23/5386* (2013.01); *H01L 24/19* (2013.01); *H01L 24/20* (2013.01); *H01L 2221/68331* (2013.01); *H01L 2221/68372* (2013.01); *H01L 2224/214* (2013.01)

(58) Field of Classification Search
CPC .................................................. H01L 23/3128
See application file for complete search history.

(56) References Cited

U.S. PATENT DOCUMENTS

2011/0277655 A1* 11/2011 Ko .................... H01L 21/76898
101/483

* cited by examiner

*Primary Examiner* — Selim U Ahmed
*Assistant Examiner* — Evan G Clinton
(74) *Attorney, Agent, or Firm* — Xuan Zhang

(57) ABSTRACT

The present disclosure provides a semiconductor device. The semiconductor device includes a substrate, a conductive feature, a redistribution layer, at least one through silicon via and at least one bump. The conductive feature is disposed over a front surface of the substrate, and the redistribution layer is disposed over a back surface opposite to the front surface. The through silicon via penetrates through the substrate and contacts the conductive feature embedded in an insulative layer. The bump contacts the redistribution layer and the through silicon via and serves as an electrical connection therebetween.

6 Claims, 21 Drawing Sheets

SEMICONDUCTOR DEVICE HAVING THROUGH SILICON VIAS

CROSS-REFERENCE TO RELATED APPLICATION

This application is a divisional application of U.S. Non-Provisional application Ser. No. 16/793,069 filed on Feb. 18, 2020, which is incorporated herein by reference in its entirety.

TECHNICAL FIELD

The present disclosure relates to a semiconductor device, and more particularly, to a semiconductor device having through silicon vias.

DISCUSSION OF THE BACKGROUND

The manufacture of low-cost semiconductor products that are more reliable, light, compact, fast, multi-functional, and highly efficient has long been an important goal for the electronics industry. As the number of input/output pins has increased significantly along with the development of highly-integrated semiconductor products, technologies to connect semiconductor chips by using a through silicon via with fine pitches have been widely developed, and a semiconductor stack structure has been applied to general-purpose applications by using these technologies.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a conductive feature, a redistribution layer, at least one through silicon via, and at least one bump. The conductive feature is disposed over a front surface of the substrate, and the redistribution layer is disposed over a back surface opposite to the front surface. The through silicon via penetrates through the substrate and contacts the conductive feature. The bump connects the redistribution layer to the through silicon via.

In some embodiments, the through silicon via includes a conductive line and an isolation liner enclosing the conductive line, and the redistribution layer comprises a plurality of horizontal segments and a plurality of vertical segments connected to the horizontal segments and disposed over the isolation liner.

In some embodiments, the semiconductor device further includes a dielectric layer disposed between the back surface of the substrate and the horizontal segments of the redistribution layer, and between the periphery of the isolation liner and the vertical segments of the redistribution layer.

In some embodiments, portions of the dielectric layer are exposed through the horizontal segments of the redistribution layer.

In some embodiments, the semiconductor device further includes a capping layer covering the horizontal segments of the redistribution layer.

In some embodiments, the capping layer has a thickness greater than thicknesses of the metallic layer and the dielectric layer.

In some embodiments, the semiconductor device further comprises an insulative layer encasing the conductive feature, wherein the through silicon via extends into the insulative layer.

Another aspect of the present disclosure provides a method of manufacturing a semiconductor device. The method includes steps of creating at least one trench in a semiconductor wafer; depositing an isolation film in the trench; depositing a conductive material on the isolation film to form at least one conductive line in the trench; forming a conductive feature, electrically coupled to conductive line, over a front surface of the semiconductor wafer; thinning the semiconductor wafer until a back surface, opposite to the front surface, of the semiconductor wafer is below an end surface of the isolation film; forming a metallic layer over the back surface of the semiconductor wafer and over a portion of a periphery of the isolation film exposed through the semiconductor wafer; performing a grinding process to remove portions of the metallic layer and the isolation film until the conductive line is exposed; and forming at least one bump to connect the remaining portions of the metallic layer to the conductive line.

In some embodiments, the method further includes a step of performing a patterning process to remove portions of the metallic layer prior to the formation of the bump.

In some embodiments, the metallic layer has a topology following the topology of the exposed portions of the isolation film and the back surface of the semiconductor wafer.

In some embodiments, the metallic layer has a thickness in a range between 1 µm and 5 µm.

In some embodiments, the method further includes steps of depositing a first dielectric layer on the bask surface of the semiconductor wafer and on the portion of the periphery of the isolation film exposed through the semiconductor wafer prior to the formation of the metallic layer; and removing portions of the first dielectric layer above an end surface of the conductive lines during the grinding process. In such embodiments, the first dielectric layer has a substantially uniform thickness.

In some embodiments, the first dielectric layer has a thickness in a range between 0.5 µm and 3 µm.

In some embodiments, the method further includes steps of depositing a second dielectric layer on the metallic layer until a top surface of the second dielectric layer, over the semiconductor wafer, is above an end surface of the conductive line; and removing portions of the second dielectric layer above an end surface of the conductive lines during the grinding process. In such embodiments, the second dielectric layer has a substantially uniform thickness.

In some embodiments, a thickness of the second dielectric layer is in a range between 0.5 µm and 5 µm.

In some embodiments, the method further includes a step of performing a patterning process to sequentially remove portions of the second dielectric layer and the metallic layer.

In some embodiments, a distance between the end surfaces of the isolation liners and the back surface of the semiconductor wafer is in the range between 0.5 µm and 10 µm.

In some embodiments, the method further includes steps of forming an insulating layer to encase a periphery of the isolation film and the conductive feature concurrent with the formation of the conductive feature.

In some embodiments, the formation of the trench includes steps of sequentially forming a buffer layer and a sacrificial layer on the front surface of the semiconductor wafer; forming at least one opening penetrating through the buffer layer and the sacrificial layer; and etching the semiconductor wafer through the opening to form the trench, wherein the buffer layer and the sacrificial layer are removed after the deposition of the conductive material, so that an end surface of the conductive line is above the front surface of the semiconductor wafer.

In some embodiments, the thinning of the semiconductor wafer includes steps of performing a grinding process to reduce a thickness of the semiconductor wafer, wherein the isolation film is not exposed after the performing of the grinding process; and performing an etching process to further reduce the thickness of the semiconductor wafer until the back surface of the semiconductor wafer is below the end surface of the isolation film.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
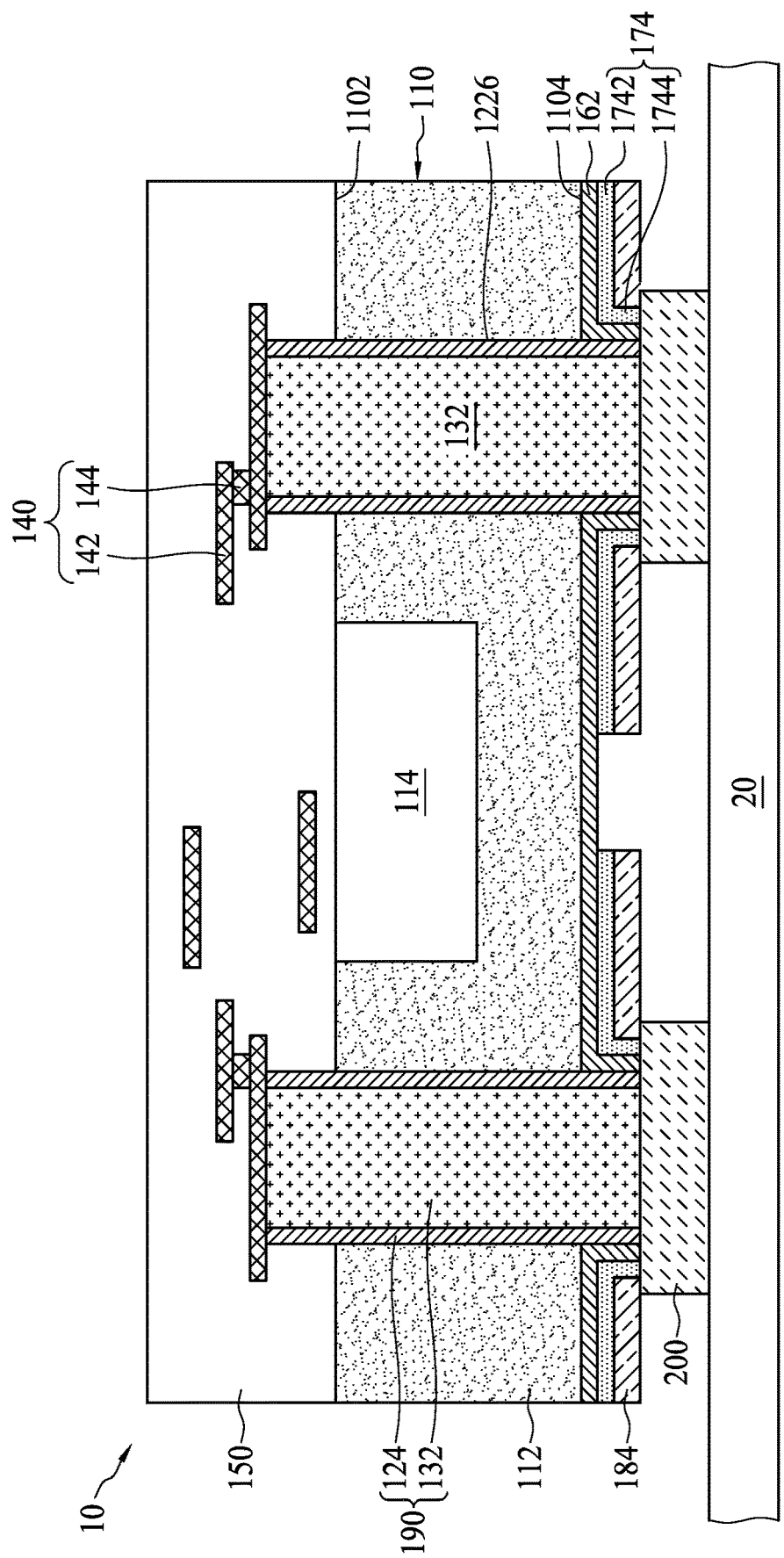
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 includes a substrate 110, a conductive feature 140 disposed over a front surface 1102 of the substrate 110, a redistribution layer 174 disposed over a back surface 1104 opposite to the front surface 1102, one or more through silicon vias 190 penetrating through the substrate 110 and contacting the conductive feature 140, and one or more bumps 200 connecting the redistribution layer 174 to the through silicon vias 190.

The substrate 110 includes a wafer 112 and one or more main components 114 disposed in the wafer 112. The conductive feature 140 includes a plurality of horizontal members 142 alternately stacked with a plurality of vertical members 144. The through silicon via 190 serves as an electrical interconnection between the conductive feature 140 and the bumps 200. The through silicon via 190 includes a conductive line 132 penetrating through the wafer 112 and an isolation liner 124 enclosing the conductive line 132. The redistribution layer 174 includes a plurality of horizontal segments 1742 parallel to the back surface 1104 of the substrate 110 and a plurality of vertical segments 1744 disposed over a periphery 1226 of the isolation liner 124. In other words, the isolation liner 124 separates the vertical segments 1744 of the redistribution layer 174 from the conductive line 132. The horizontal segments 1742 and the vertical segments 1744 connected to the horizontal segments 1742 are integrally formed. The bump 200, contacting the through silicon via 190 and the vertical segments 1744 of the redistribution layer 174, serves as an electrical connection between the conductive line 132 and the redistribution layer 174. In the semiconductor device 10, the conductive lines 132 and the bumps 200 collectively serve as electrical connections to the conductive feature 140 and the redistribution layer 174.

The semiconductor device 10 further includes a dielectric layer 162 disposed between the back surface 1104 of the substrate 110 and horizontal segments 1742 of the redistribution layer 174 and between the periphery 1226 of the isolation liners 124 and the vertical segments 1744 of the redistribution layer 174. The semiconductor device 10 also includes a capping layer 184 disposed on the horizontal segments 1742 of the redistribution layer 174 and an insulative layer 150 disposed on the front surface 1102 of the substrate 110 and encasing the conductive feature 140.

The semiconductor device 10 can be electrically connected to an external device 20 through the bumps 200 to form an electronic system. In other words, the bumps 200 serve as input/output (I/O) connections to electrically connect the semiconductor device 10 to the external device 20.

Figure 2:
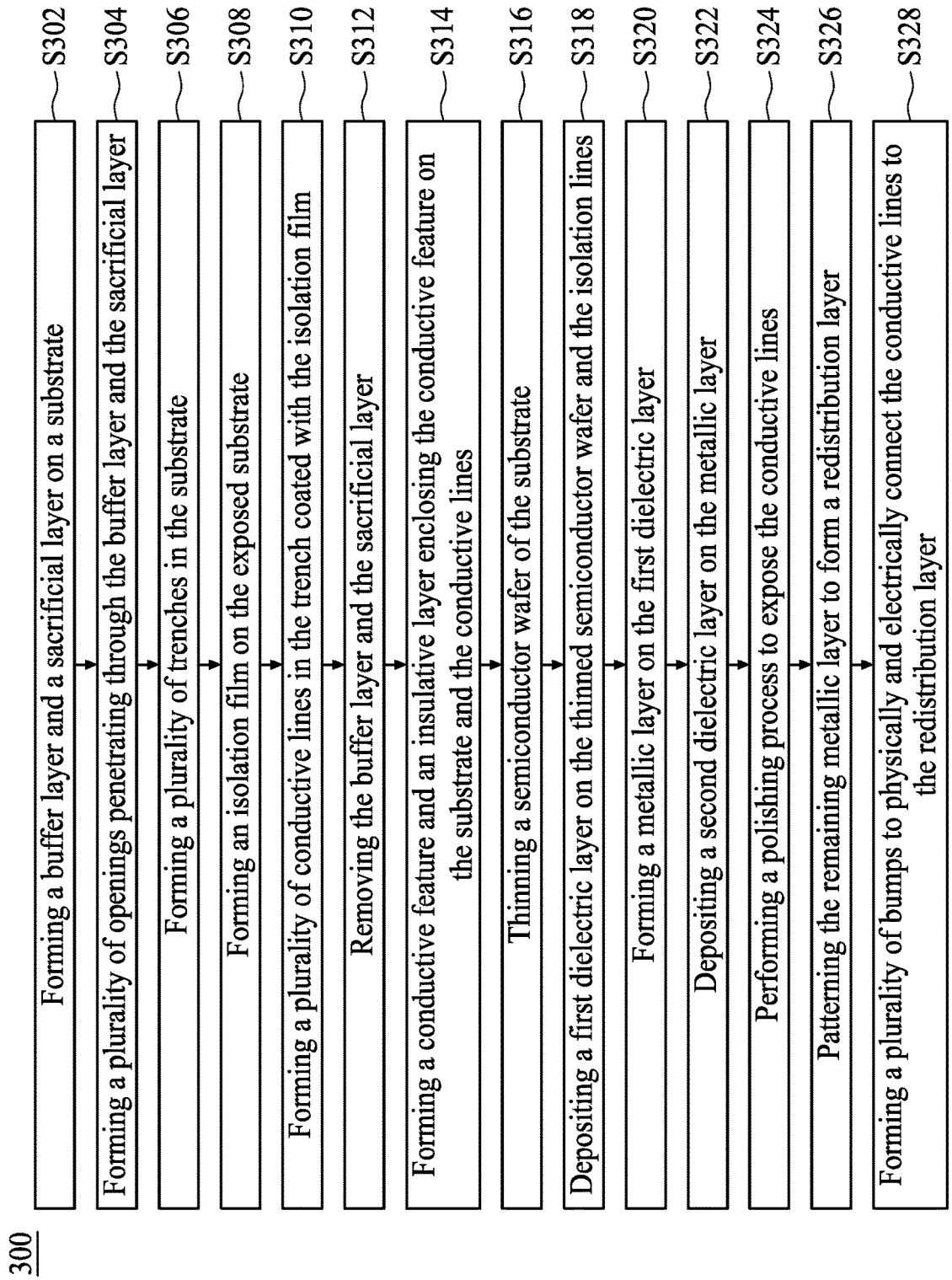
FIG. 2 is a flow diagram illustrating a method of manufacturing a semiconductor device in accordance with some embodiments of the present disclosure.

FIG. 2 is a flow diagram illustrating a method 300 of manufacturing a semiconductor device 10 in accordance with some embodiments of the present disclosure, and FIGS. 3 through 21 illustrate cross-sectional views of intermediate stages in the formation of the semiconductor device 10 in accordance with some embodiments of the present disclosure. The stages shown in FIGS. 3 to 21 are also illustrated schematically in the flow diagram in FIG. 2. In the following discussion, the fabrication stages shown in FIGS. 3 to 21 are discussed in reference to the process steps shown in FIG. 2.

Figure 3:
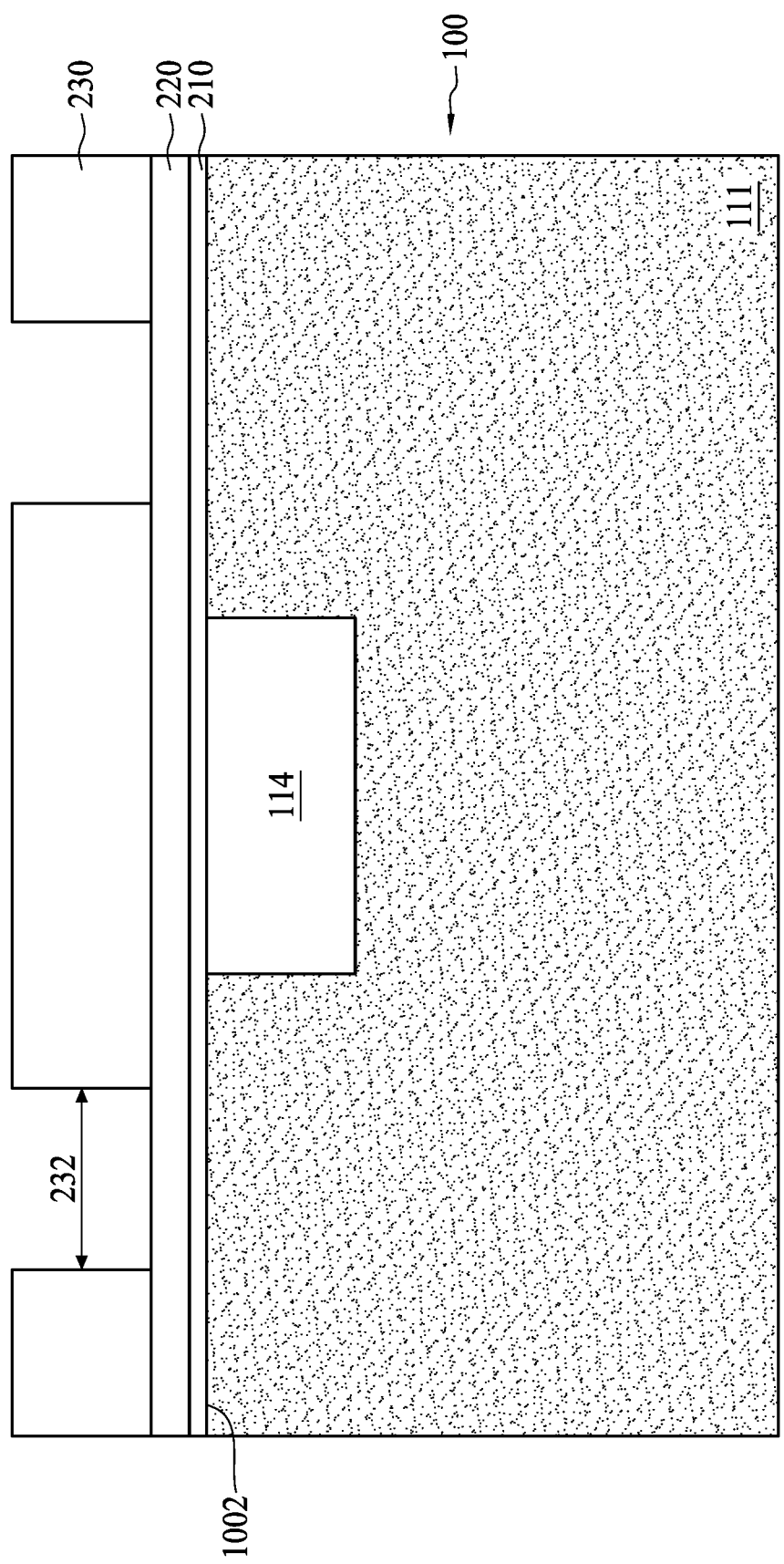
FIGS. 3 through 21 illustrate cross-sectional views of intermediate stages in the formation of a semiconductor structure in accordance with some embodiments of the present disclosure.

Referring to FIG. 3, a buffer layer 210 and a sacrificial layer 220 are formed on a substrate 100 according to a step S302 in FIG. 2. The substrate 100 includes a semiconductor wafer 111 and one or more main components 114 disposed in the semiconductor wafer 111. The semiconductor wafer 111 can be made of silicon. Alternatively or additionally, the semiconductor wafer 111 may include other elementary semiconductor materials such as germanium. In some embodiments, the semiconductor wafer 111 is made of a compound semiconductor such as silicon carbide, gallium arsenic, indium arsenide, or indium phosphide. In some embodiments, the semiconductor wafer 111 is made of an alloy semiconductor such as silicon germanium, silicon germanium carbide, gallium arsenic phosphide, or gallium indium phosphide. In some embodiments, the semiconductor wafer 111 can include an epitaxial layer. For example, the semiconductor wafer 111 has an epitaxial layer overlying a bulk semiconductor. The semiconductor wafer 111 may include various doped regions (not shown) doped with p-type dopants, such as boron, and/or n-type dopants, such as phosphorus or arsenic. In some embodiments, isolation features (not shown), such as shallow trench isolation (STI) features or local oxidation of silicon (LOCOS) features, can be introduced in the semiconductor wafer 111 to define and isolate various main components 114 in the semiconductor wafer 111. The main components 114 may be formed in active areas (not shown) defined by the isolation features.

The main components 114 may include active components, such as transistors and/or diodes, and passive components such as capacitors, resistors or the like. The main components 114 are formed using various processes including deposition, etching, implantation, photolithography, annealing, and/or other applicable processes. In some embodiments, the main components 114 may be formed in the semiconductor wafer 111 during front-end-of-line (FEOL) processes.

The buffer layer 210 and the sacrificial layer 220 are sequentially stacked on the substrate 100, wherein the buffer layer 210 protects against contamination and mitigates stress at the interface between the substrate 100 and the sacrificial layer 220. The buffer layer 210, including silicon-containing dielectric, covers the entire front surface 1002 of the substrate 100. The buffer layer 210, including silicon dioxide, for example, can be formed using a chemical vapor deposition (CVD) process or a thermal oxidation process. In other words, the buffer layer 210 can be a deposition layer or an oxidized layer, wherein the thermally-grown oxides can include a higher level of purity than the deposited oxides.

The sacrificial layer 220, covering the buffer layer 210, functions as a hard mask for patterning the semiconductor wafer 111. The sacrificial layer 220 may be formed of an inorganic material, including nitride, using a CVD process, a physical vapor deposition (PVD) process, a spin-coating process, or another suitable process that can form the inorganic material. The sacrificial layer 220 includes silicon nitride in some embodiments, for example.

Next, a first photoresist mask 230 is applied on the sacrificial layer 220. The first photoresist mask 230 includes one or more windows 232 to expose portions of the sacrificial layer 220. The first photoresist mask 230 is formed by performing an exposure process and a develop process on a photosensitive material that fully covers the sacrificial layer 220, wherein the photosensitive material may be applied on the sacrificial layer 220 by a spin-coating process and then dried using a soft-baking process.

Figure 4:
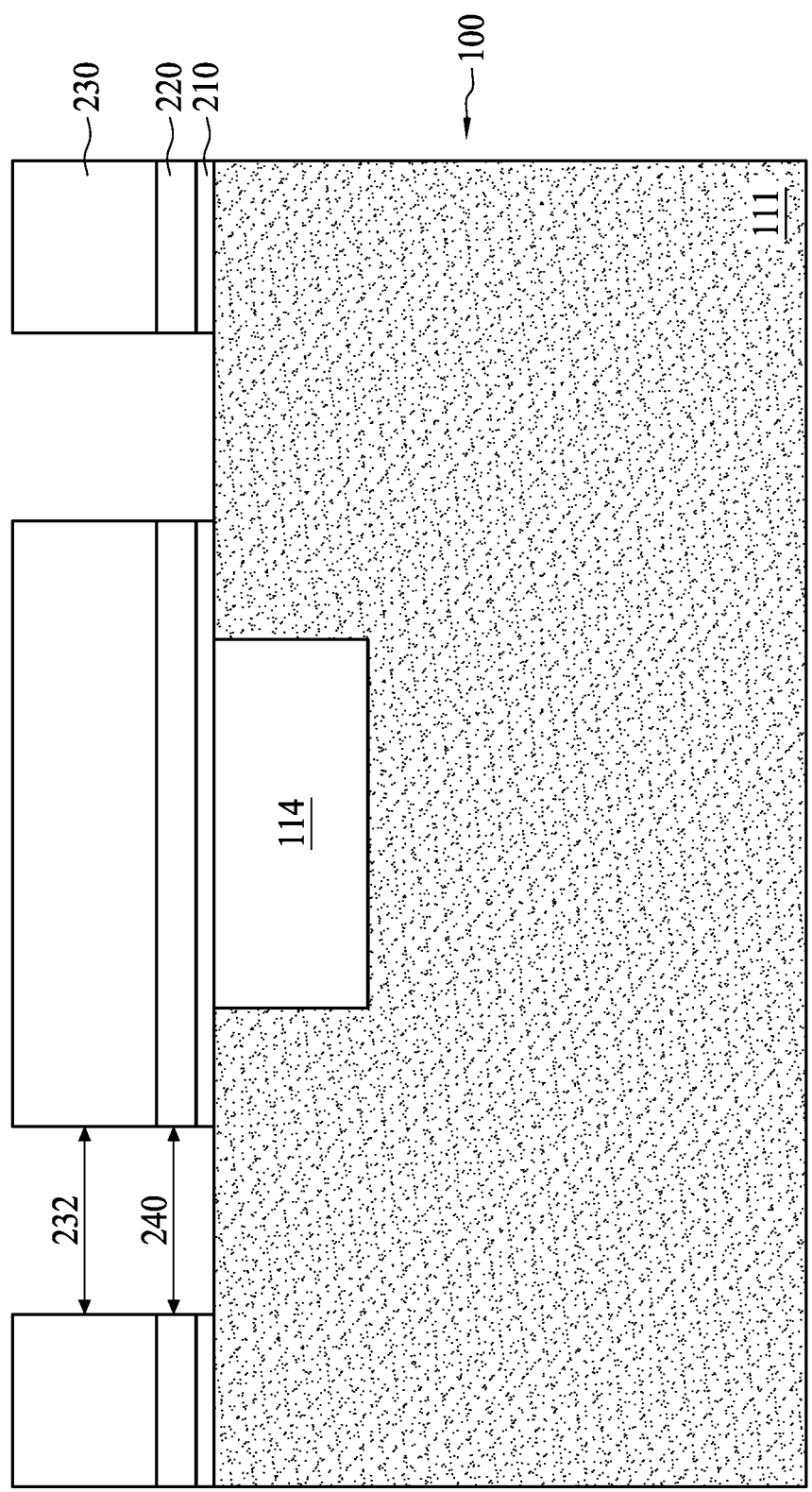

Referring to FIG. 4, the sacrificial layer 220 and the buffer layer 210 are sequentially etched through the windows 232 to form a plurality of openings 240 penetrating through the sacrificial layer 220 and the buffer layer 210 according to a step S304 in FIG. 2. Consequently, portions of the semiconductor wafer 111 are exposed through the openings 240. The openings 240 are formed using at least one etching process to remove portions of the sacrificial layer 220 and portions of the buffer layer 210 not protected by the first photoresist mask 230. In should be noted that the etching process may utilize multiple etchants, selected based on the materials of the buffer layer 210 and the sacrificial layer 220, to etch the buffer layer 210 and the sacrificial layer 220. The first photoresist mask 230 is removed after the performing of the etching process using an ashing process or a wet strip process, for example.

Figure 5:
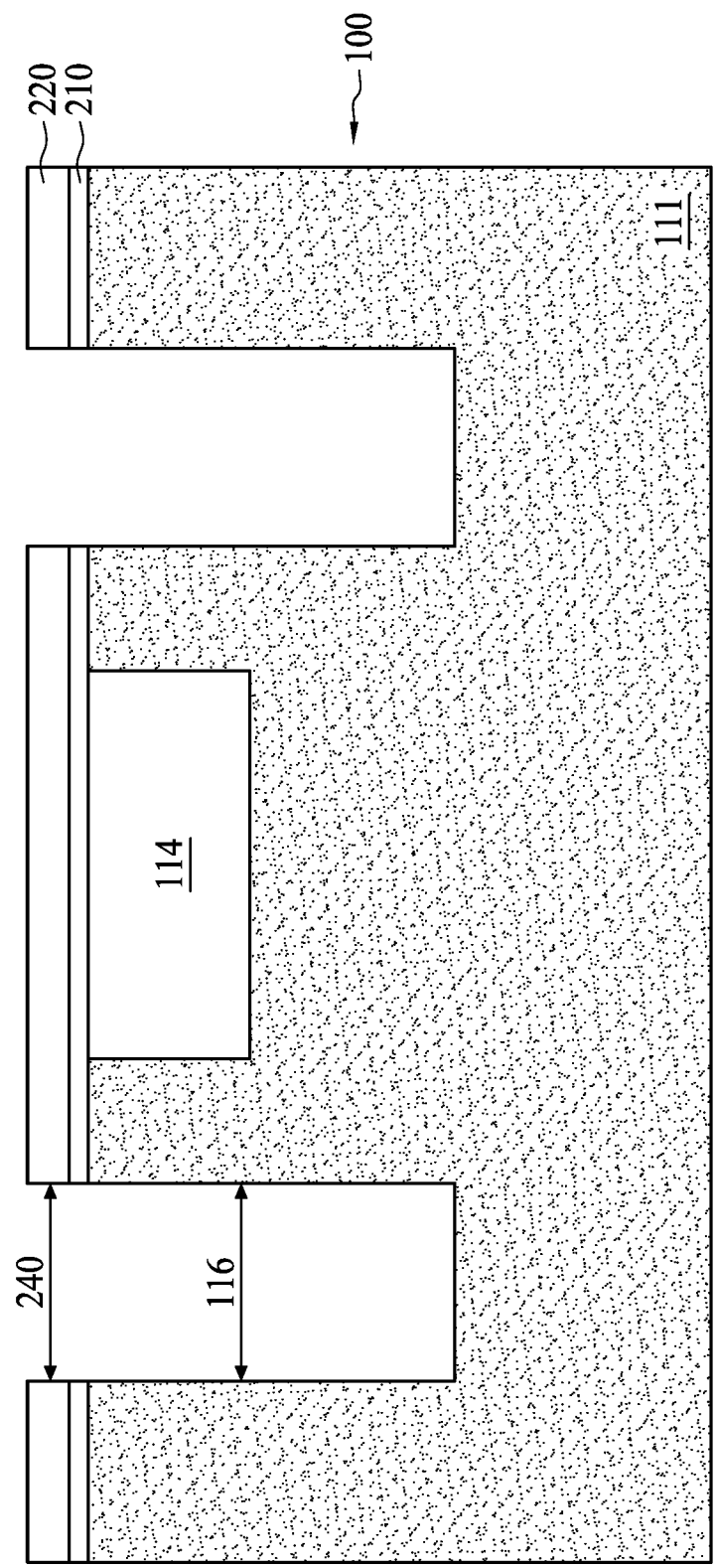

Referring to FIG. 5, the substrate 100 is etched through the openings 240 to form a plurality of trenches 116 in the substrate 100 according to a step S306 in FIG. 2. The substrate 100 is anisotropically dry-etched, using a reactive ion etching (RIE) process, for example, through the openings 240 to form the trenches 116 in the semiconductor wafer 111, so that the width in the openings 240 is maintained in the trenches 116. In some embodiments, the trenches 116 can have a uniform width, but the present disclosure is not limited thereto.

Figure 6:
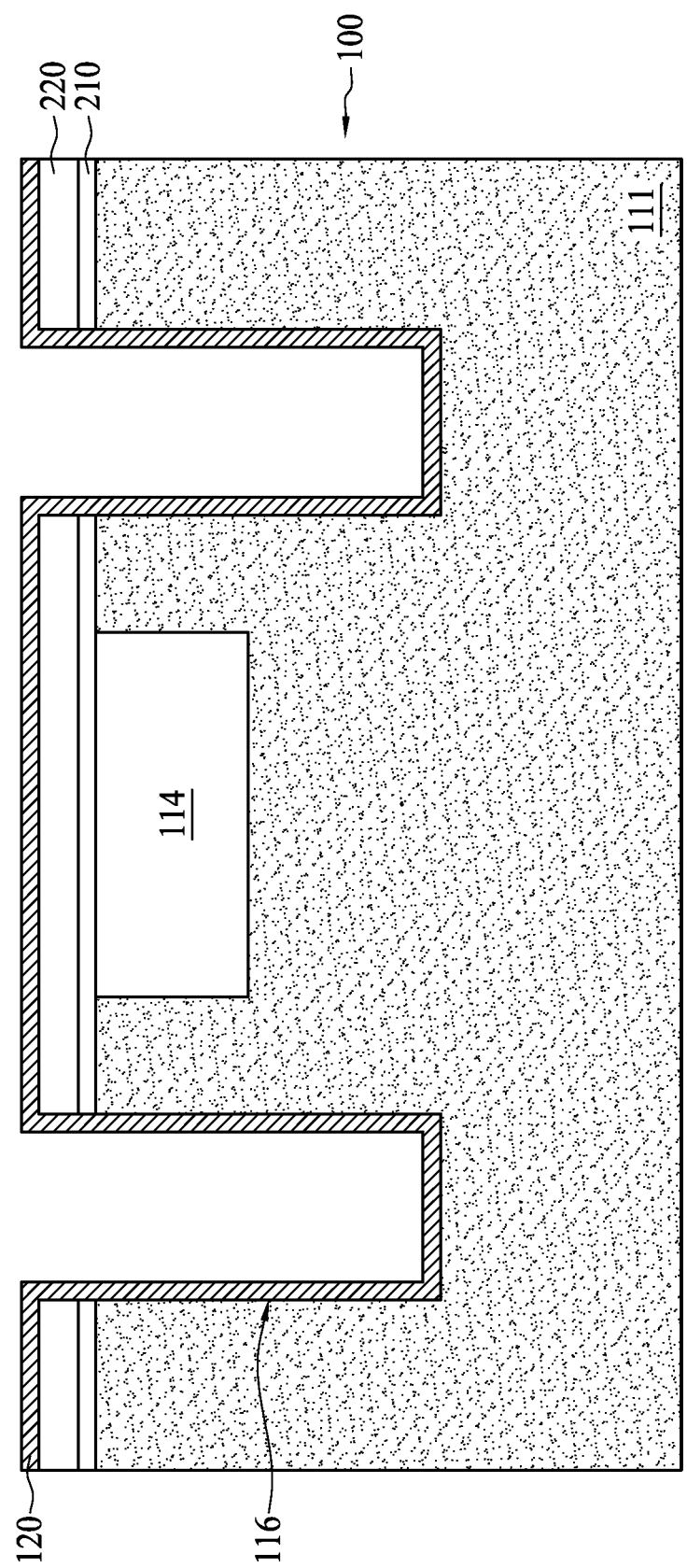

Referring to FIG. 6, an isolation film 120 is formed on an exposed portion of the substrate 100 according to a step S308 in FIG. 2. The isolation film 120, having a substantially uniform thickness, covers the exposed portion of the substrate 110, but does not fill the trench 116. The isolation film 120 preferably includes a material having a high etching selectivity to the semiconductor wafer 111. In some embodiments, the isolation film 120 may be grown on the exposed portion of the substrate 110 using a thermal oxidation process. In alternative embodiments, the isolation film 120 can be deposited not only on the exposed portion of the substrate 110 but also on exposed portions of the buffer layer 210 and the sacrificial layer 220. In other words, the isolation film 120 has a topology following the topology of the exposed portions of the substrate 210, the buffer layer 210 and the sacrificial layer 220. By way of example, the isolation film 120 includes oxide, nitride, oxynitride or high-k material and can be deposited using a CVD process, an ALD process, or the like.

Figure 7:
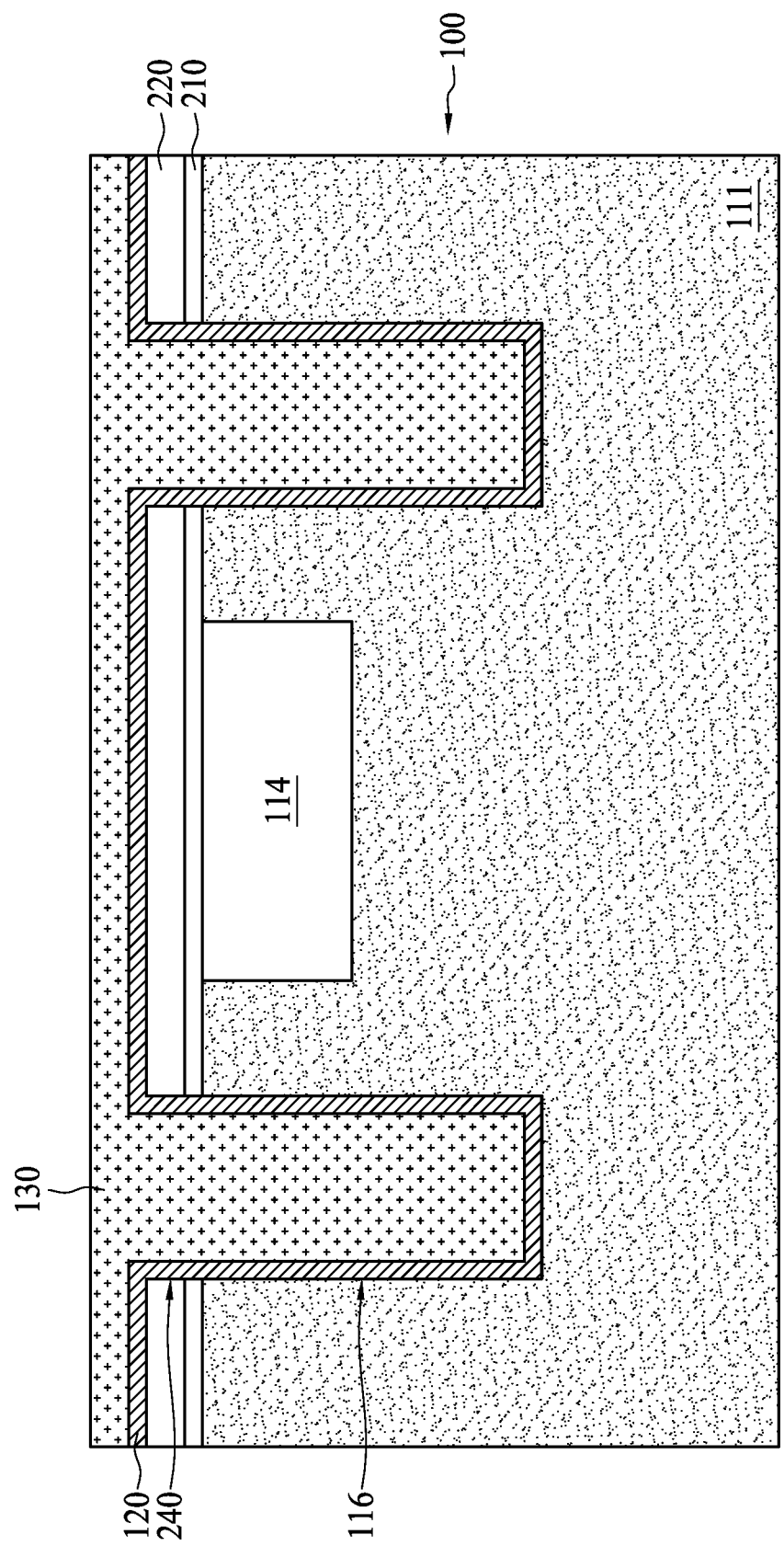
Figure 8:
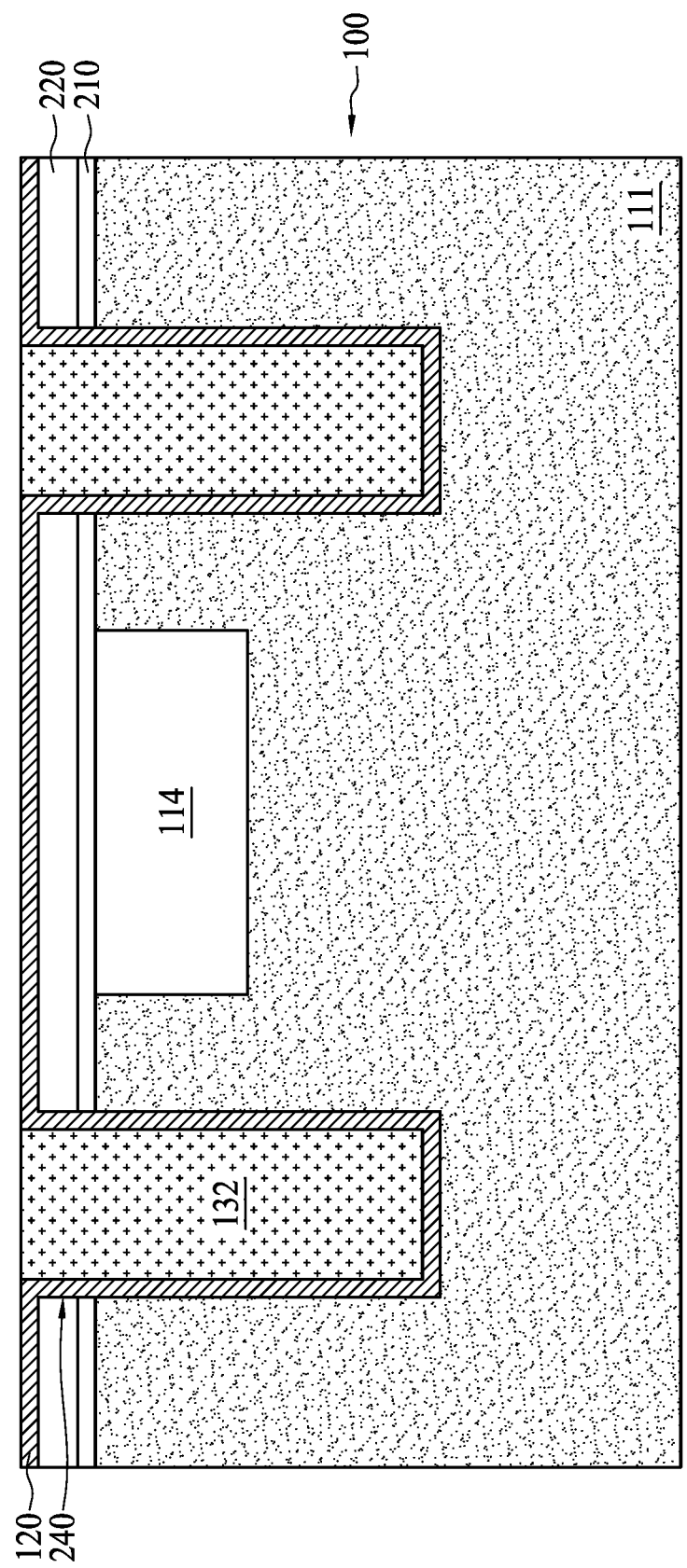

Referring to FIGS. 7 and 8, a plurality of conductive lines 132 are formed in the trenches 116, which are coated with the isolation film 120 according to a step S310 in FIG. 2. The formation of the conductive lines 132 includes (1) conformally and uniformly depositing a conductive material 130 on the isolation film 120 (as shown in FIG. 7) until the conductive material 130 fully fills the trenches 116, and (2) performing a planarizing process to remove the conductive material 130 overflowing the trench 116 and the openings 240. As shown in FIG. 8, the conductive lines 132 penetrate through the buffer layer 210 and the sacrificial layer 220 and extend into the substrate 100.

The conductive lines 132 may include polysilicon or metal, such as copper, tungsten, aluminum, silver, gold, indium or the like. The conductive lines 132 may be formed using a CVD process, a PVD process, an ALD process, or another suitable process. In some embodiments, the conductive material 130 including copper may be formed on the isolation film 120 using a plating process. The planarizing process can include a chemical mechanical polishing (CMP) process and/or a wet etching process. In some embodiments, a diffusion barrier layer (not shown) may be formed, for example, using a PVD process, a CVD process, or the like on the isolation film 120 prior to the formation of the conductive material 130 to prevent the conductive lines 132 from flaking or spalling from the isolation film 120.

Figure 9:
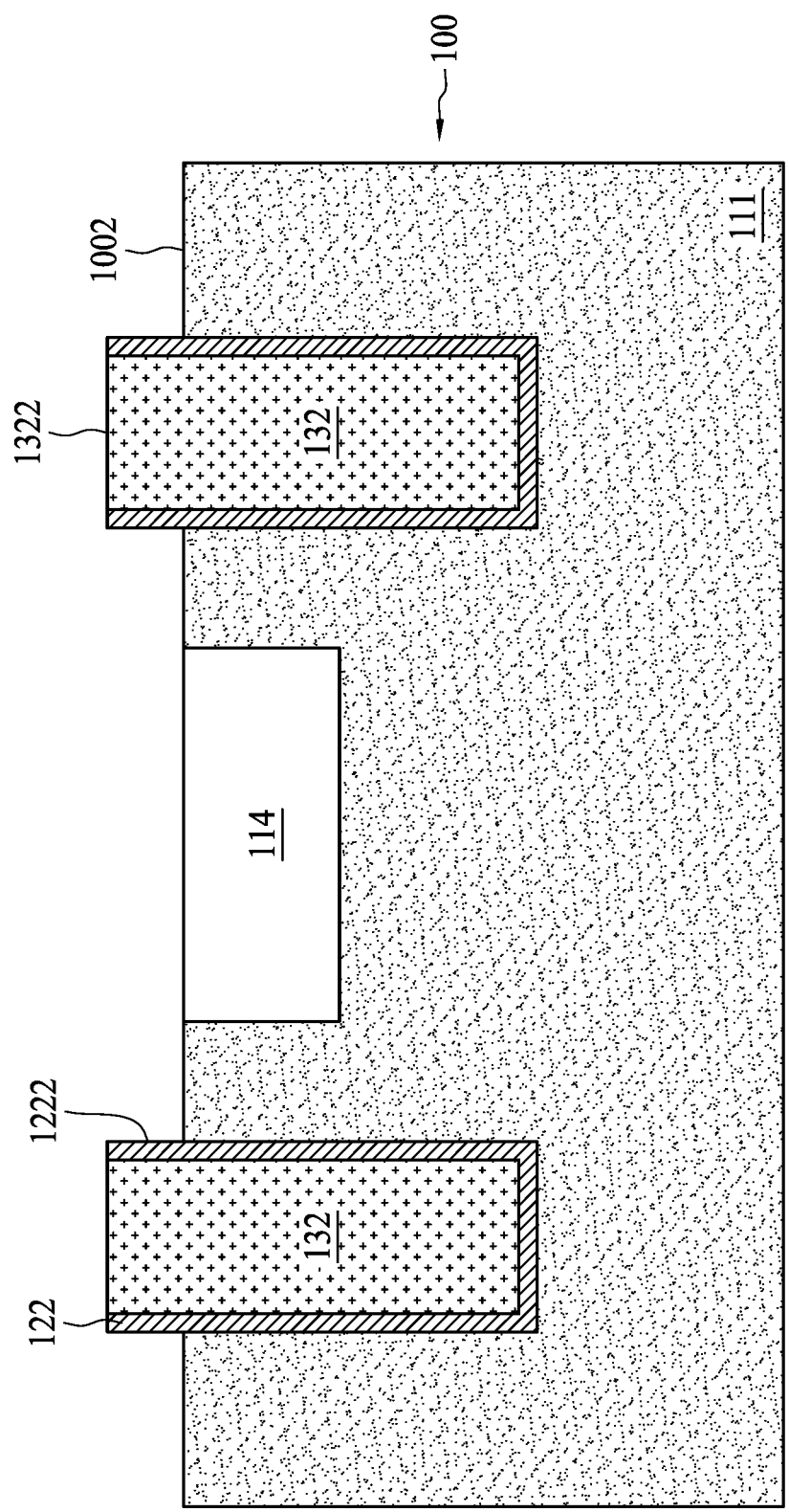

Referring to FIG. 9, a portion of the isolation film 120, on the stacked buffer layer 210 and the sacrificial layer 220, the sacrificial layer 220, and the buffer layer 210 are sequentially removed according to a step S312 in FIG. 2. Consequently, the front surface 1002 of the substrate 100 is exposed and isolation liners 122, enclosing the conductive lines 132, are formed. In some embodiments, the portion of the isolation film 120 may be removed from the stacked buffer layer 210 and the sacrificial layer 220 using a polish process, and the sacrificial layer 220 and the buffer layer 210 are sequentially removed using wet etching processes. The sacrificial layer 220 may serve as a polish stop layer during the performing of the polishing process. After the removal of the sacrificial layer 220 and the buffer layer 210, a portion of a periphery 1222 of the isolation liner 122 is exposed. As shown in FIG. 9, the conductive lines 132 have an end surface 1322 above the front surface 1002 of the substrate 100.

Figure 10:
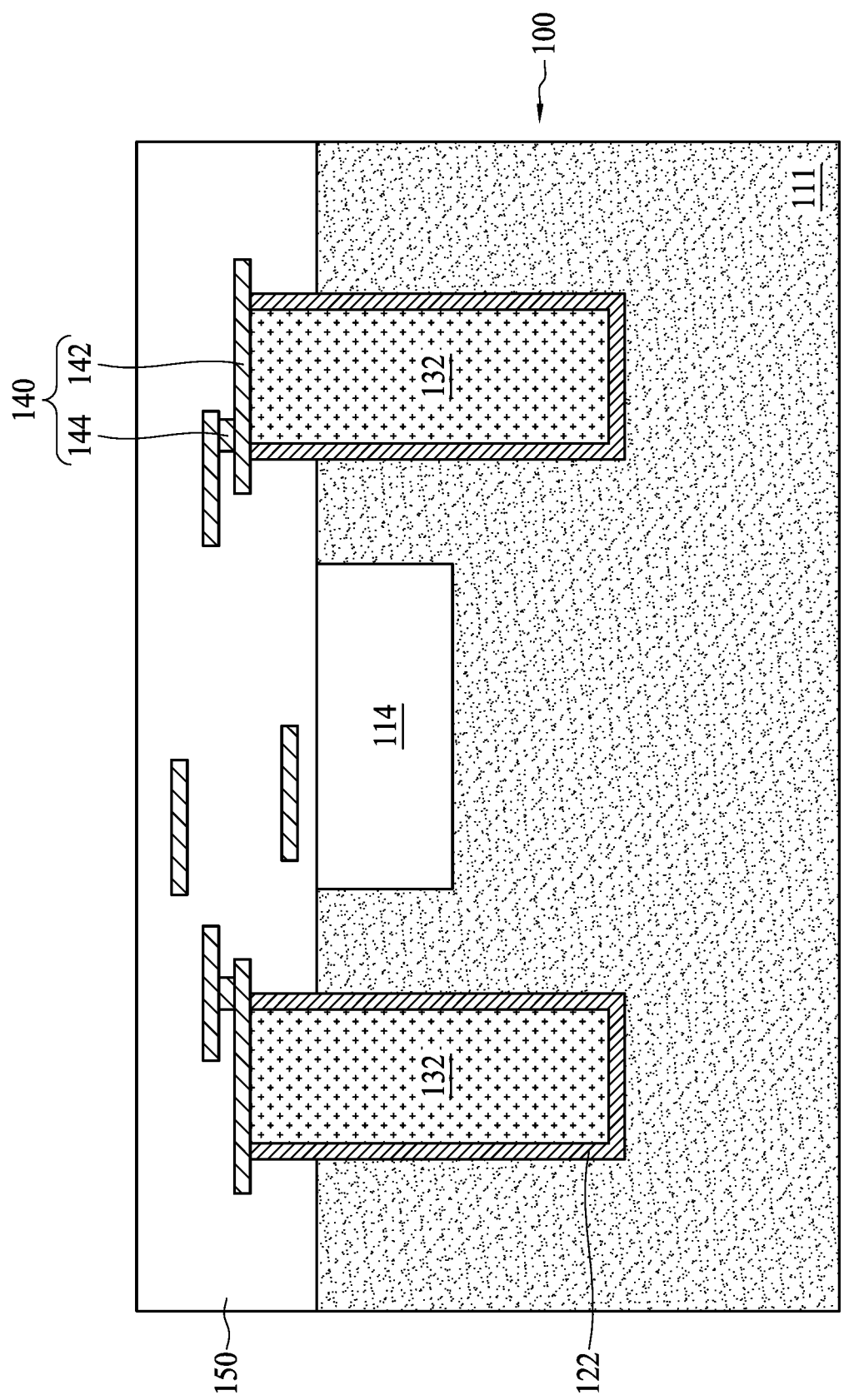

Referring to FIG. 10, a conductive feature 140 and an insulative layer 150, enclosing the conductive feature 140, are formed on the substrate 100, the isolation liners 122 and the conductive lines 132 according to a step S314 in FIG. 2. The conductive feature 140, electrically coupled to the main components 114 and/or the conductive lines 132, includes a plurality of horizontal members 142 alternately stacked with a plurality of vertical members 144. In some embodiments, the main components 114 may interconnect with one another through the conductive feature 140 to form, for example, a logic device, a memory device, an input/output device, a system-on-chip device, another suitable type of device, or a combination thereof.

The horizontal members 142 may be made of copper or aluminum using plating processes; the vertical members 144 may be made of tungsten using CVD processes. Referring to FIGS. 9 and 10, the insulative layer 150 encases the exposed portions of the peripheries 1222 of the isolation liners 122 and covers portions of the front surface 1002 of the substrate 100 and portions of the end surfaces 1322 of the conductive lines 132 exposed through the conductive features 140. The insulative layer 150 includes silicon oxide, silicon nitride, oxynitride, borosilicate glass (BSG), low-k material, another suitable material or a combination thereof. The formation of the insulative layer 150 includes performing one or more processes by CVD or spin coating. In some embodiments, the horizontal members 142 and the vertical members 144 may be formed in the insulative layer 140 using the well-known damascene processes. In some embodiments, the conductive feature 140 and the insulative layer 150 are formed in back-end-of-line (BEOL) processes, for example.

Figure 11:
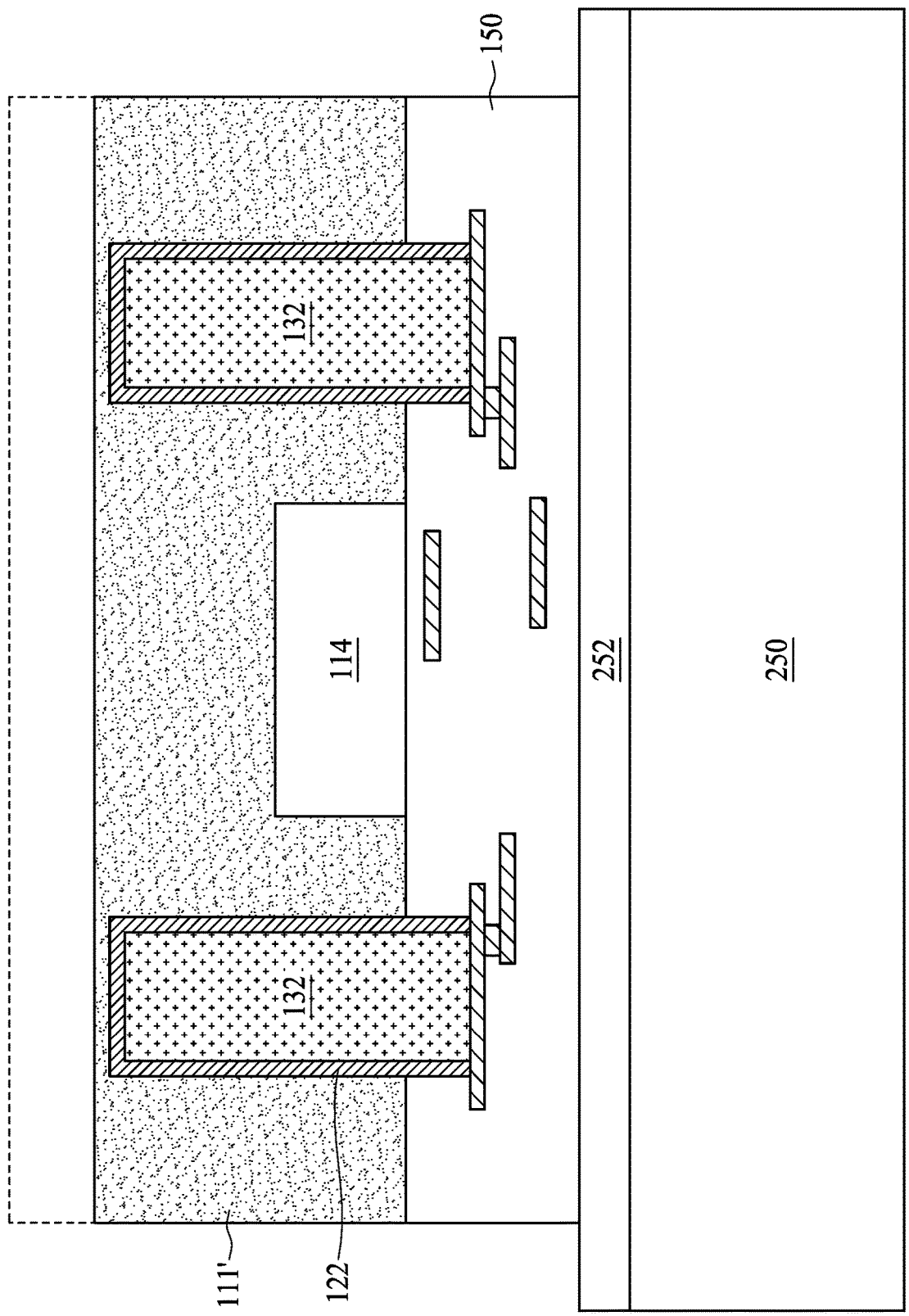
Figure 12:
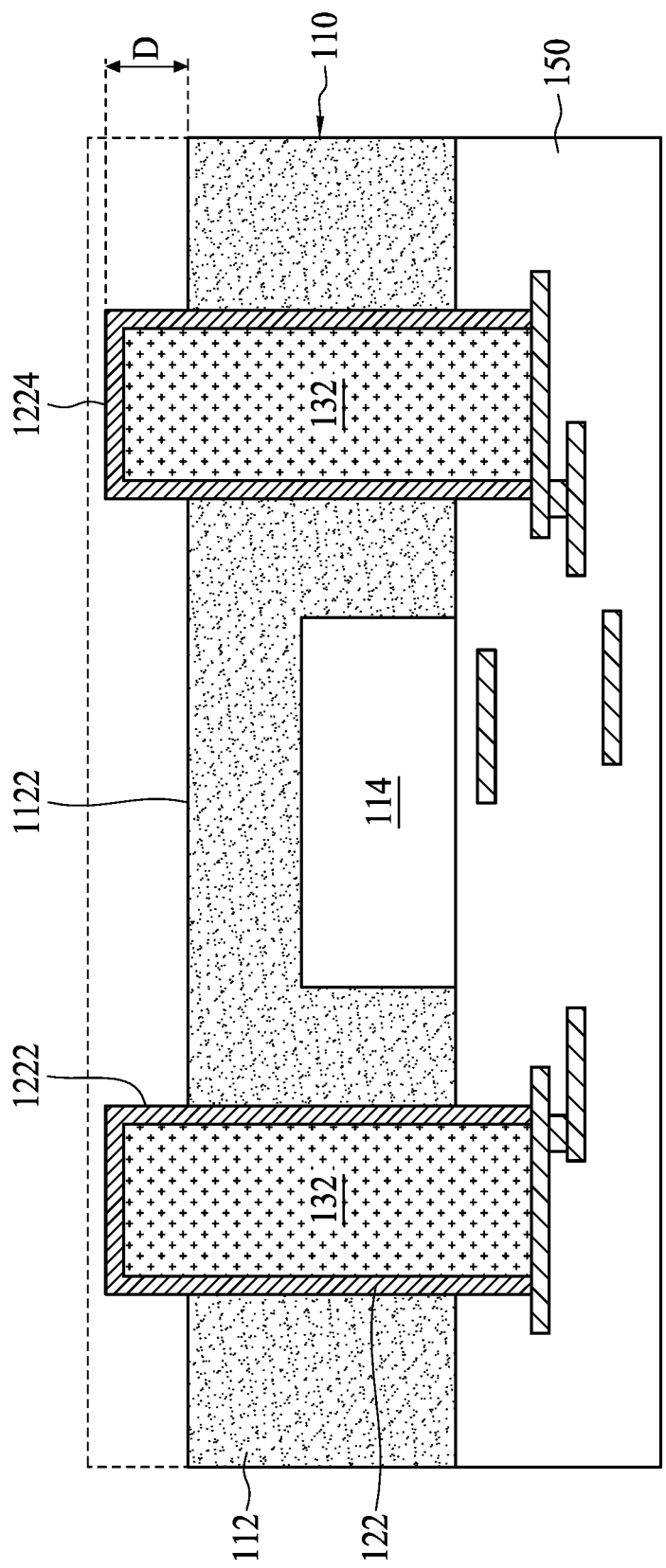

Referring to FIGS. 11 and 12, thinning processes are performed to thin the semiconductor wafer 111 according to a step S316 in FIG. 2. Consequently, another portion of the periphery 1222 of the isolation liner 122, opposite to the portion of the periphery 1222 encapsulated by the insulative layer 150, is exposed. Referring to FIG. 11, prior to the performing of the thinning processes, the resulting structure shown in FIG. 10 is flipped upside down and bonded to a carrier wafer 250 through an adhesive layer 252. In other words, the insulative layer 150 is in contact with the adhesive layer 252. The carrier wafer 250 can be a blank glass carrier, a blank ceramic carrier, or the like. The adhesive layer 252 can be decomposed when exposed to heat or light, and hence the adhesive layer 252 can release the carrier wafer 250 from the thinning structure. In some embodiments, the carrier wafer 250 may be reusable such that it can be used again after removal. In other words, the carrier wafer 250 can be used again; for example, the carrier wafer 250 can repeatedly implement the step S316 to manufacture intermediate structures, as shown in FIGS. 11 to 12.

The thinning of the semiconductor wafer 111 includes (1) performing a grinding process on the semiconductor wafer 111 to reduce a thickness thereof, so that a ground wafer 111' is formed, and (2) performing an etching process to expose another portion of the periphery 1222 of the isolation liners 122, thereby forming an etched wafer 112. The etched wafer 112 and the main components 114 constitute a substrate 110. In FIG. 11, the dotted line marks an original thickness of the semiconductor wafer 111, and the isolation liners 122 are not exposed through the ground wafer 111'. In FIG. 12, the dotted line marks an original thickness of the ground wafer 111'. In some embodiments, the etching process to reduce a thickness of the ground wafer 111' is performed until a distance D between end surfaces 1224 of the isolation liners 122 and a back surface 1122 of the etched wafer 112 is in the range between 0.5 μm and 10 μm, such as about 5 μm. The isolation liners 122 remaining on the conductive lines 132 after the performing of the thinning processes function as passivation to shield the ground wafer 111' and the etched wafer 112 from the metal material in the conductive lines 132 during cleaning processes after the grinding and etching processes.

Figure 13:
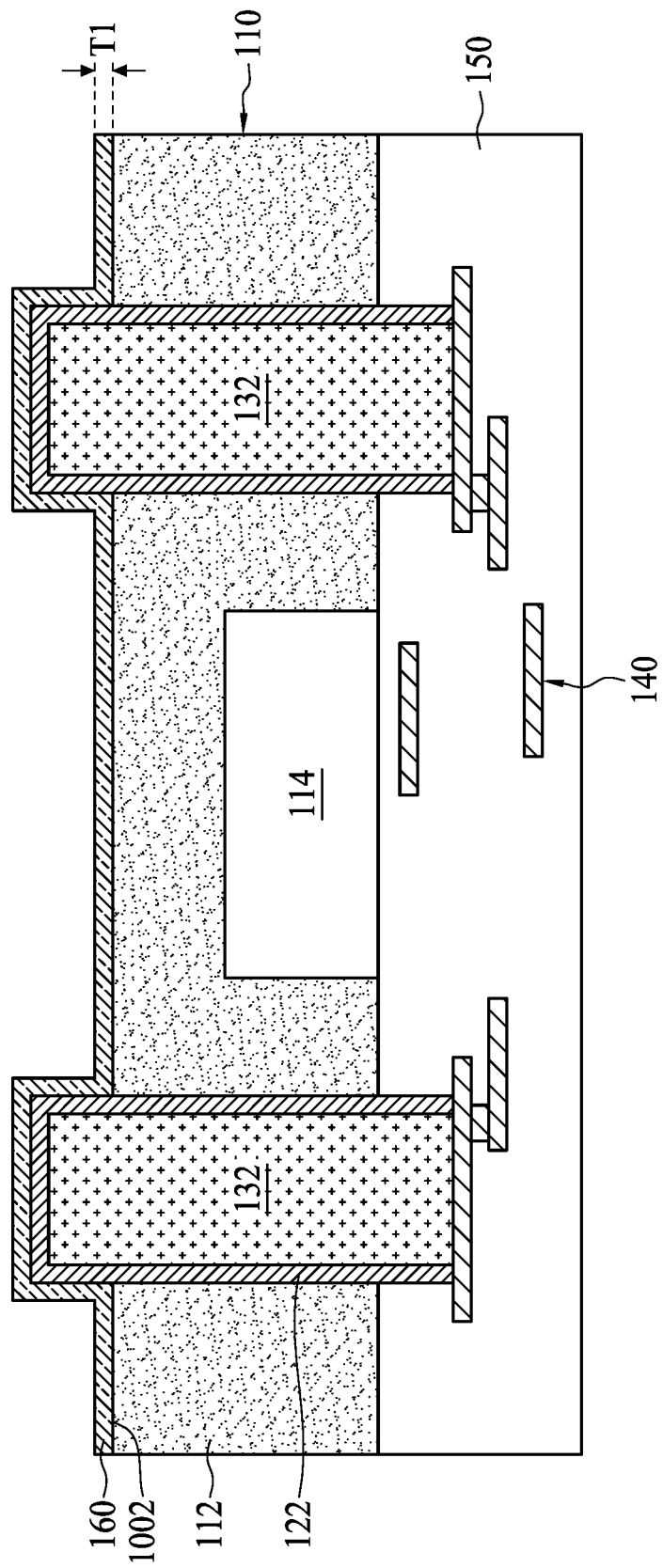

Referring to FIG. 13, a first dielectric layer 160 is formed on the back surface 1122 of the etched wafer 112 and the exposed portions of the isolation liners 122 according to a step S318 in FIG. 2. The first dielectric layer 160 is conformally and uniformly formed on the etched wafer 112 and the isolation liners 122. In other words, the first dielectric layer 160 has a topology following the topology of the etched wafer 112 and the exposed portion of the isolation liners 122. The first dielectric layer 160 has a first thickness T1, which may be, for example, in a range between 0.5 μm and 3 μm, such as about 2 μm. The first dielectric layer 160 includes silicon-containing material, such as silicon oxide or silicon nitride. In some embodiments, the first dielectric layer 160 may be formed using a spin-coating process, a plasma-enhanced CVD process, or another suitable process that can form a dielectric material.

Figure 14:
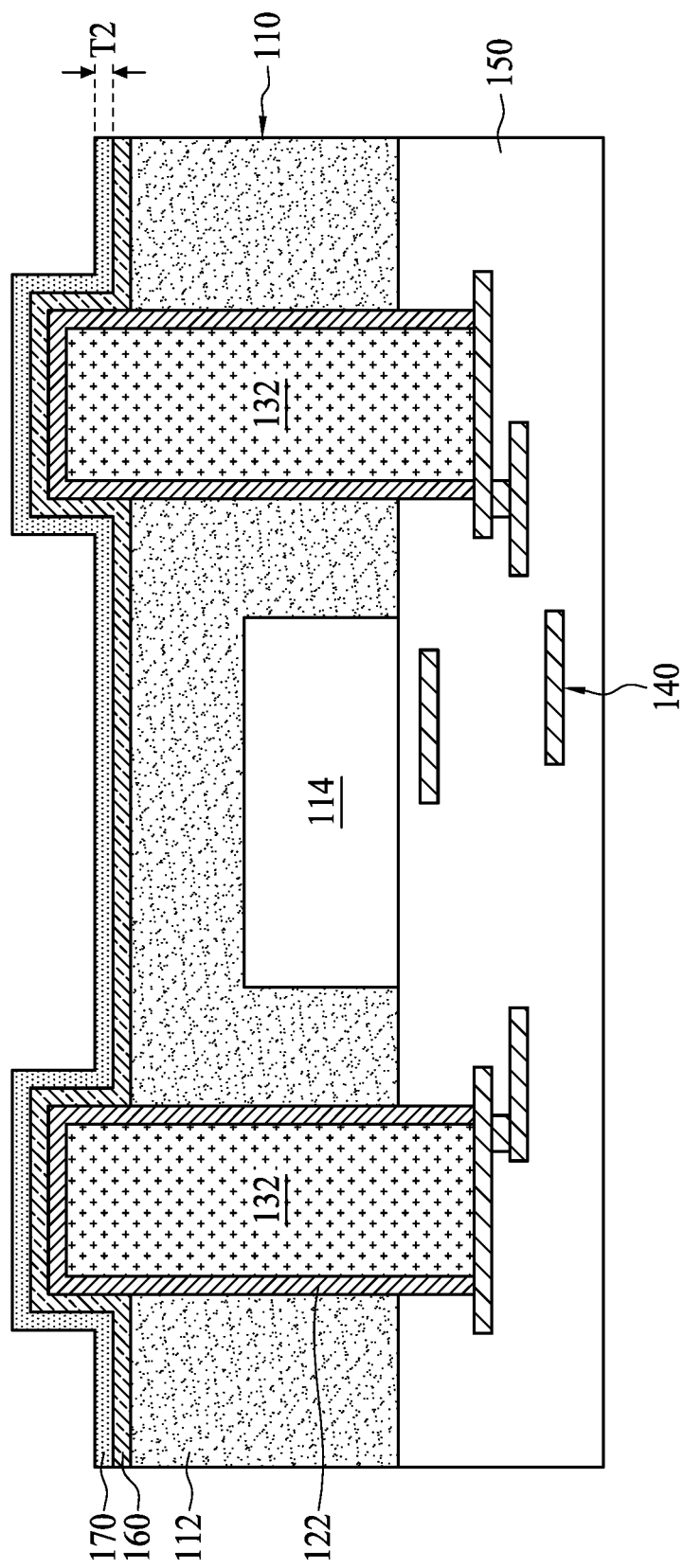

Referring to FIG. 14, a metallic layer 170 is formed on the first dielectric layer 160 according to a step S320 in FIG. 2. The metallic layer 170 is conformally and uniformly deposited on the first dielectric layer 160, so that the first dielectric layer 160 is buried in the metallic layer 170. The first dielectric layer 160 functions as a buffer layer for mitigating stress at the interface between the metallic layer 170 and the isolation liners 122 and is employed to shield the metal material in the metallic layer 170 from entering the etched wafer 112.

The metallic layer 170 has a second thickness T2 substantially equal to or greater than the first thickness T1 of the dielectric layer 160. In some embodiments, the second thickness T2 may be, for example, in a range between 1 μm and 5 μm, such as 2 μm. The metallic layer 170 may include copper, aluminum, tungsten, cobalt, titanium, gold, platinum or a combination thereof. The metallic layer 170 can be formed using a CVD process, a PVD process or a sputtering process.

Figure 15:
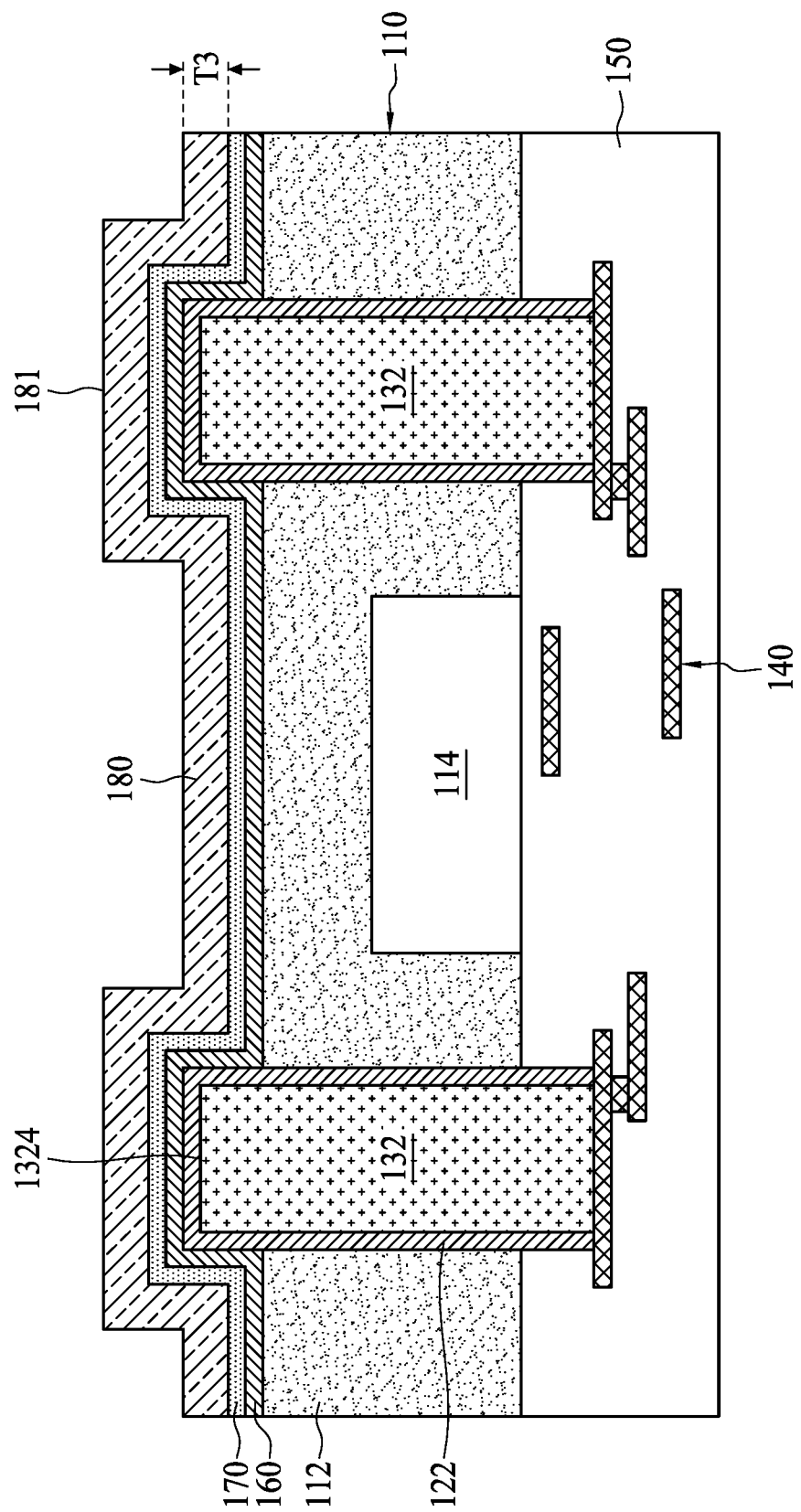

Referring to FIG. 15, a second dielectric layer 180 is deposited on the metallic layer 170 according to a step S322 in FIG. 2. The second dielectric layer 180 is conformally and uniformly deposited on the metallic layer 170. The second dielectric layer 180 is deposited until a top surface 181 of the second dielectric layer 180 over the etched wafer 112 is above an end surface 132a of the conductive line 132. The second dielectric layer 180 includes silicon-containing material, and has a third thickness T3 substantially equal to or greater than the first thickness T1 of the dielectric layer 160. In some embodiments, the third thickness T3 may be, for example, in a range between 0.5 μm and 5 μm, such as 3 μm. In some embodiments, the first and second dielectric layers 160 and 180 may have different dielectric materials. The second dielectric layer 180, including silicon oxide or silicon nitride, for example, is formed using a spin-coating process, a plasma-enhanced CVD process, or another suitable process that can form a dielectric material.

Figure 16:
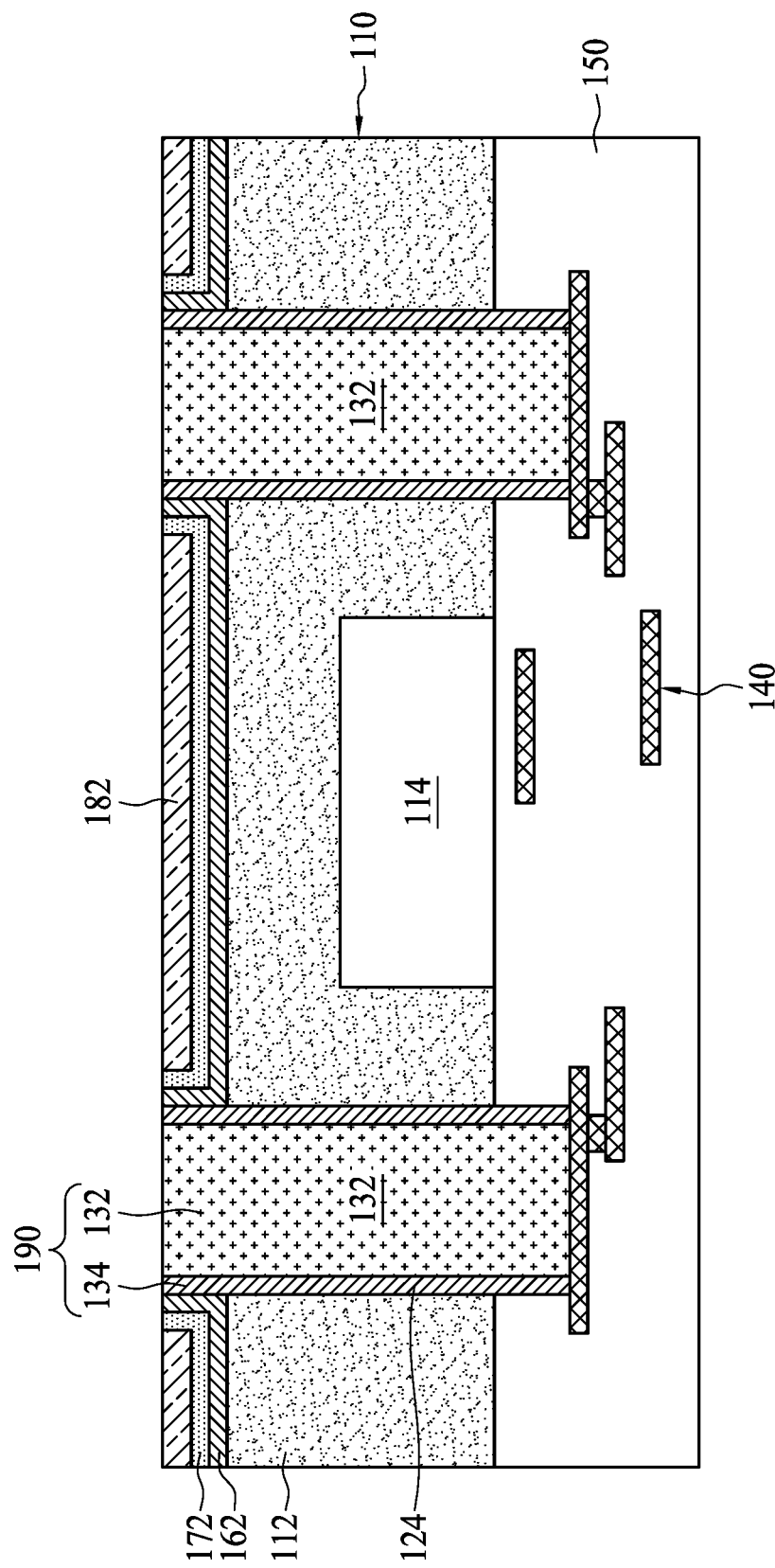

Referring to FIG. 16, a grinding process is performed to polish away portions of the isolation liners 122, the first dielectric layer 160, the metallic layer 170, and the second dielectric layer 180 according to a step S324 in FIG. 2. Accordingly, the conductive lines 132 are exposed and a plurality of through silicon vias 190 including the conductive lines 132 and isolation liners 134 are formed, wherein the conductive lines 132 are surrounded by the isolation liners 134. The remaining first dielectric layer (hereinafter referred to as the "dielectric layer") 162, the remaining metallic layer 172, and the remaining second dielectric layer 182 are disposed on either side of the through silicon vias 190. In some embodiments, the grinding process includes a chemical mechanical polishing (CMP) process and/or a wet etching process. In some embodiments, the second dielectric layer 180, covering the metallic layer 170, can be employed to maintain a desired polishing rate during the grinding process.

Figure 17:
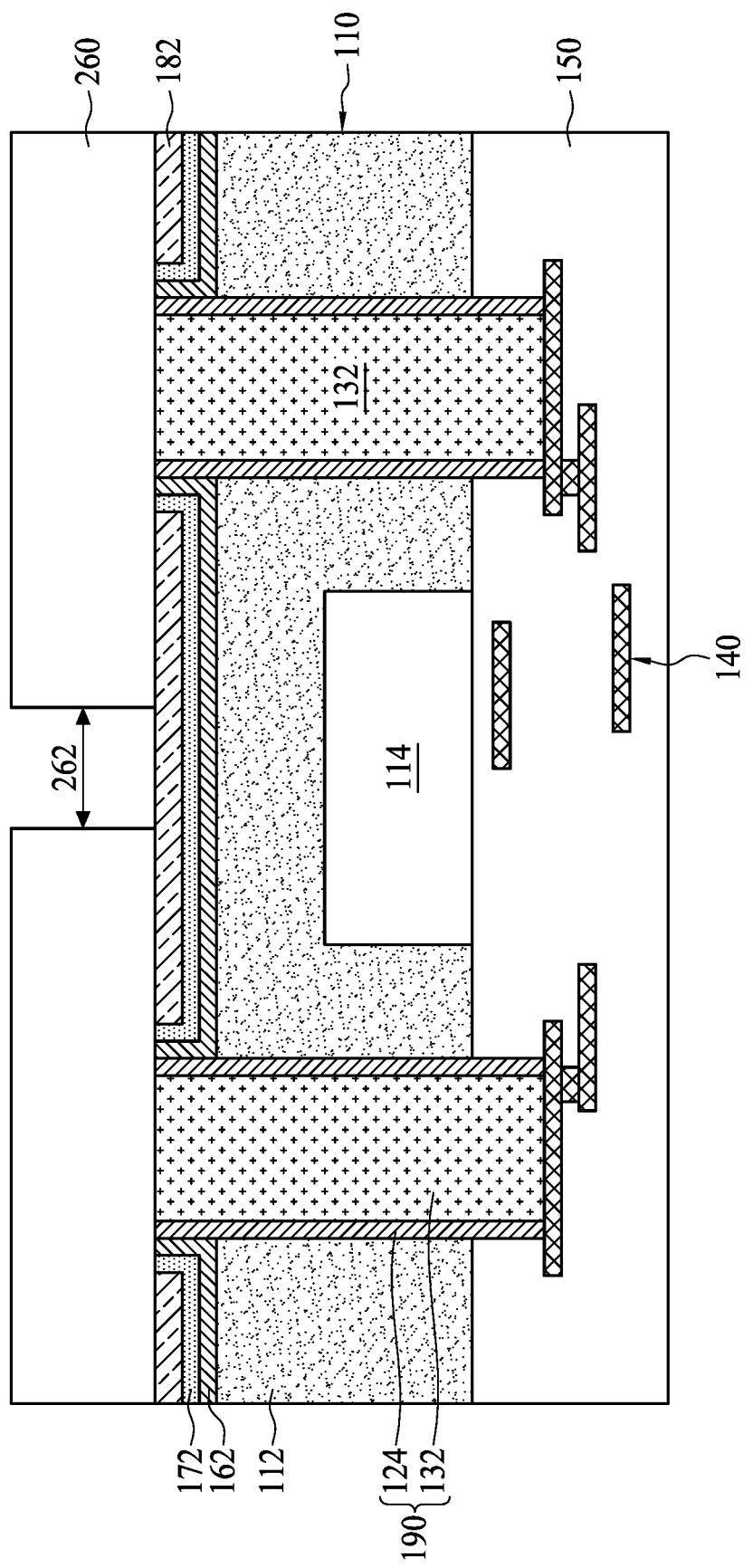

Referring to FIG. 17, a second photoresist mask 260 is applied on the dielectric layer 162, the remaining metallic layer 172, portions of the remaining second dielectric layer 182, and the through silicon vias 190. The second photoresist mask 260 is employed to pattern the remaining metallic layer 172 and the remaining second dielectric layer 182. The second photoresist mask 260 is formed by steps including (1) coating a photosensitive material on the dielectric layer 162, the remaining metallic layer 172, the remaining second dielectric layer 182, and the through silicon via 190, (2) exposing the photosensitive material to a pattern (not shown), (3) performing a post-exposure back process, and (4) developing the photosensitive material, thereby forming windows 262 to expose a portion of the remaining second dielectric layer 182 (between the through silicon vias 190). The through silicon vias 190 are protected by the second photoresist mask 260.

Figure 18:
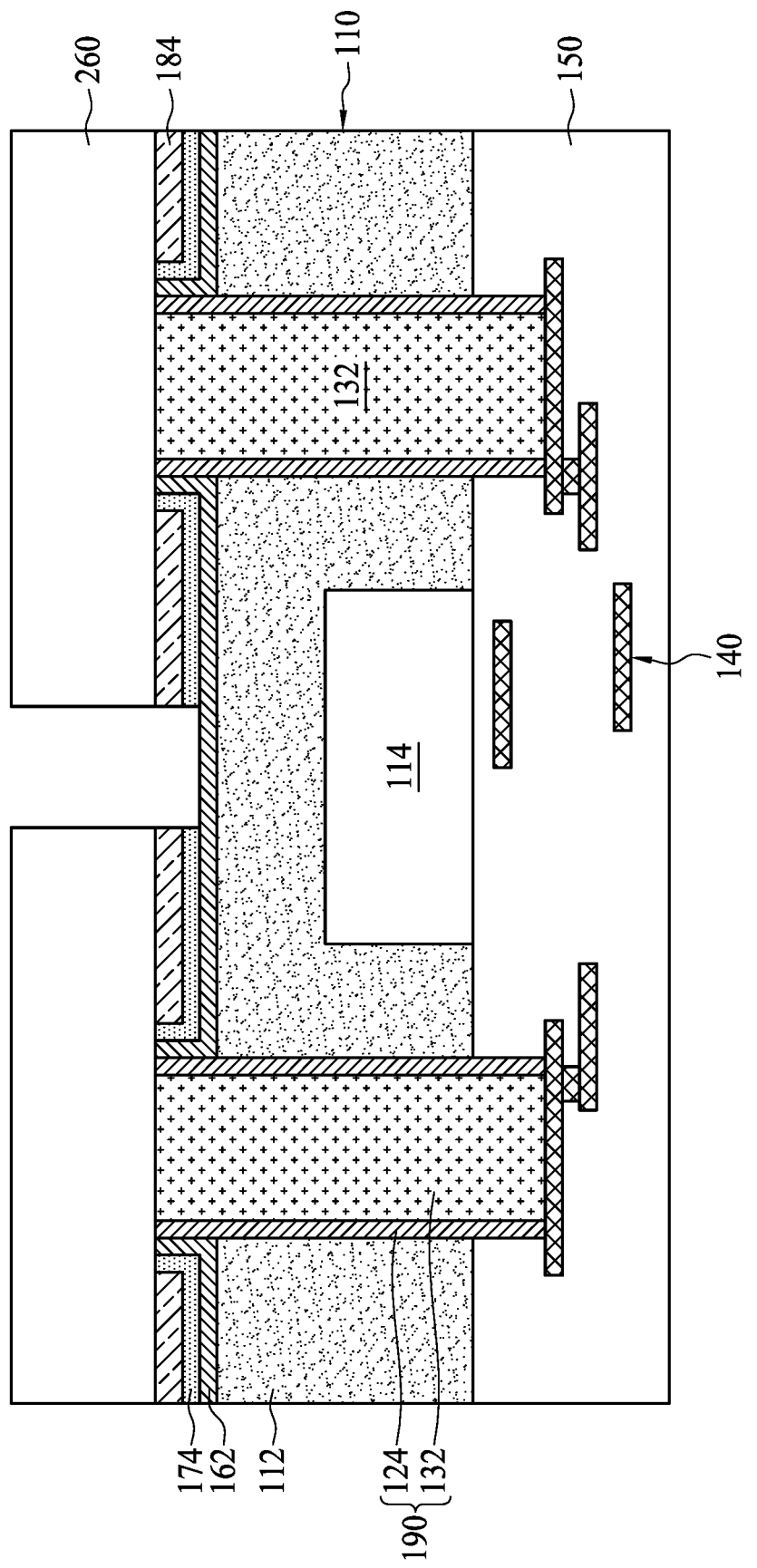

Referring to FIG. 18, a patterning process is performed to remove portions of the remaining second dielectric layer 182 and the remaining metallic layer 170 exposed through the second photoresist mask 260 according to a step S326 in FIG. 2. Consequently, a redistribution layer 174 and a capping layer 184 are formed. Referring to FIGS. 17 and 18, the remaining second dielectric layer 182 and the remaining metallic layer 170 are sequentially etched through the window 262 in the second photoresist mask 260 using one or more anisotropic processes. After the formation of the redistribution layer 174 and the capping layer 184, the second photoresist mask 260 is removed using an ashing process or a strip process, for example.

Figure 19:
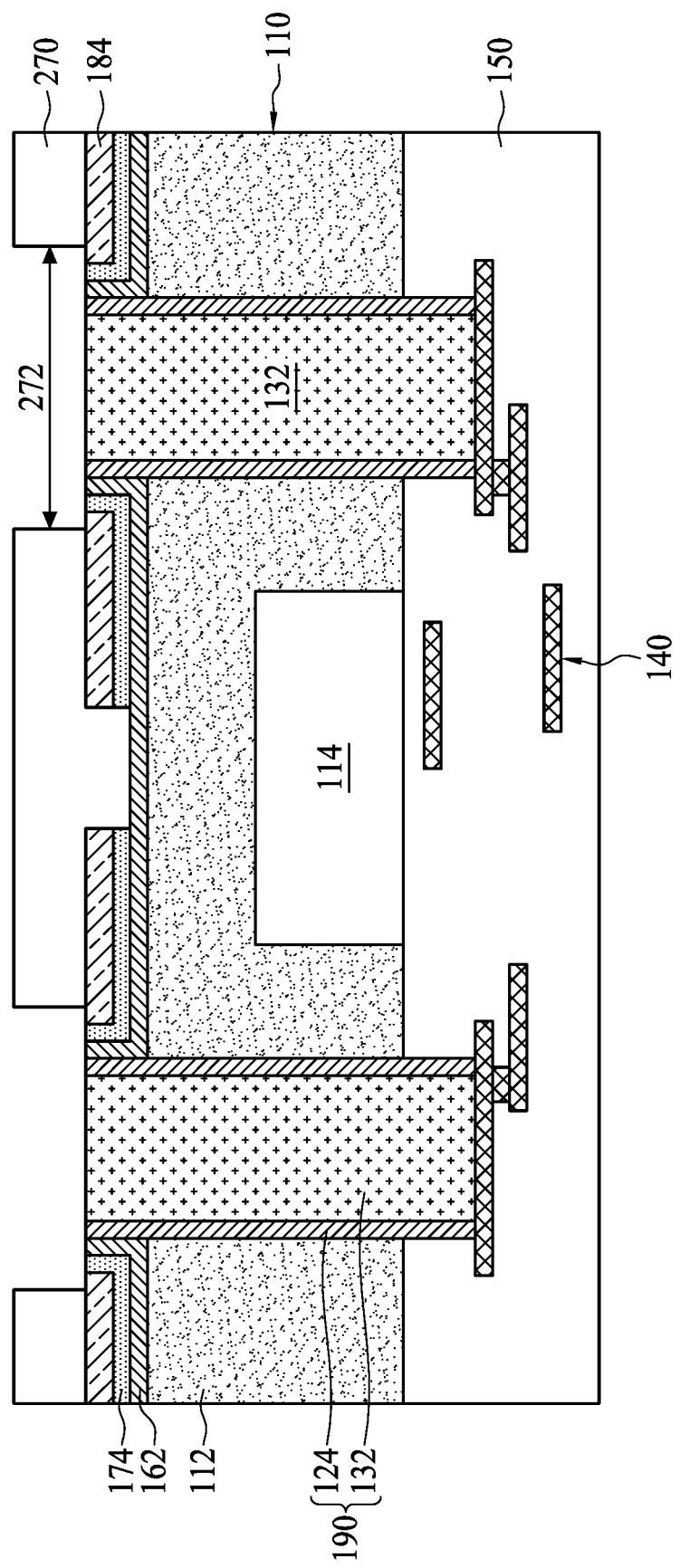

Referring to FIG. 19, after the formation of the redistribution layer 174 and the capping layer 184, a third photoresist mask 270 is applied on the redistribution layer 174 and the capping layer 184. As shown in FIG. 19, the third photoresist mask 270 includes a plurality of windows 272 to expose the dielectric layer 162, portions of the redistribution layer 174, portions of the capping layer 184, and the through silicon vias 190. The formation of the third photoresist mask 270 includes (1) applying a photosensitive material on the dielectric layer 162, the redistribution layer 174, the capping layer 184 and the through silicon vias 190 using a spin-coating process, (2) drying the photosensitive material using a soft-baking process, and (3) performing a photolithography process to form the windows 272.

Figure 20:
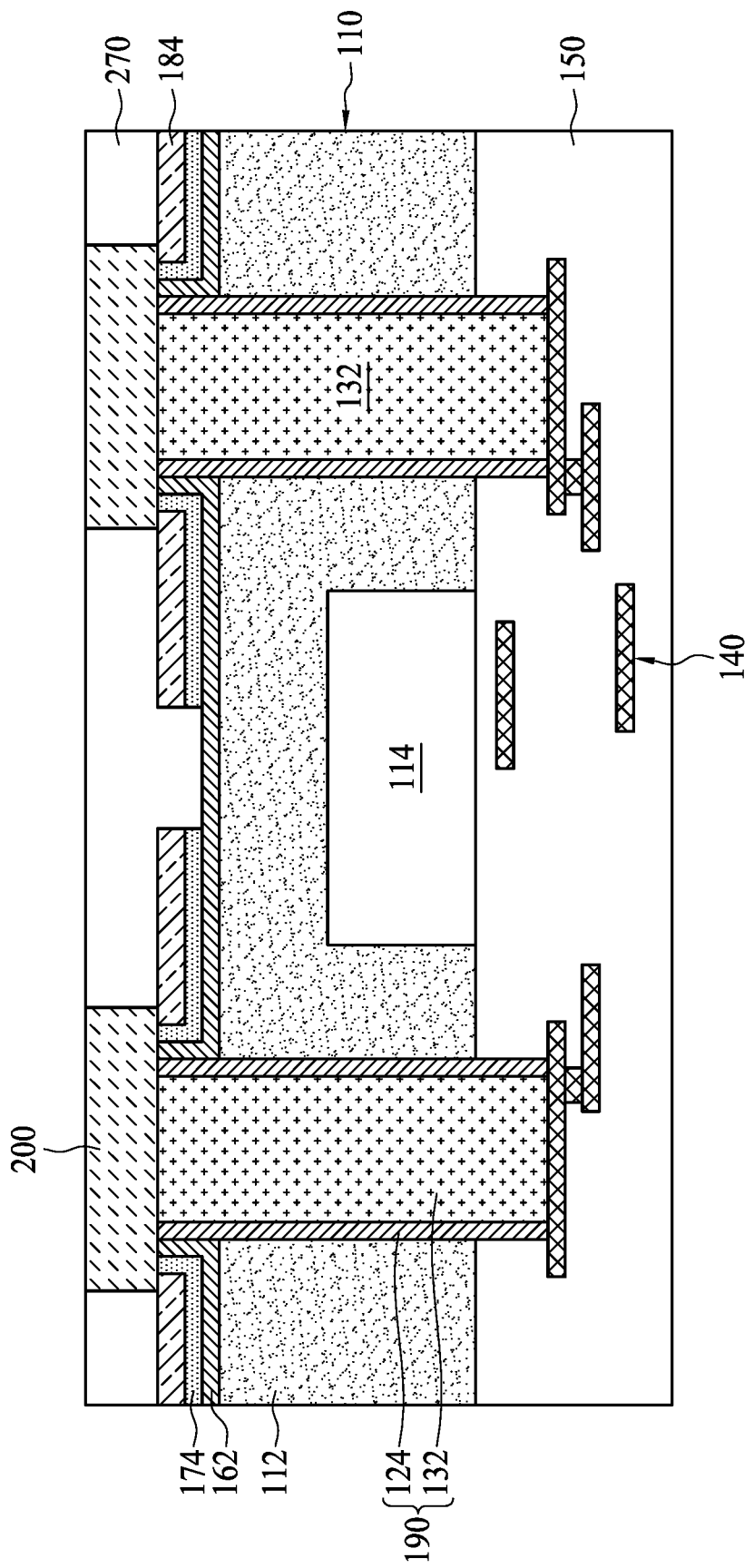

Referring to FIG. 20, a plurality of bumps 200 are disposed to connect the redistribution layer 174 to the through silicon vias 190 according to a step S328 in FIG. 2. The bumps 200 serve as an electrical interconnection between the conductive lines 132 and the redistribution layer 174. The bumps 200 can be mounted by initially placing a solder flux (not shown) on the dielectric layer 162, portions of the redistribution layer 174 and the capping layer 184, and the through silicon vias 190, then disposing the bumps 200 on the solder flux; once the bumps 200 are in contact with the solder flux, a reflow may be performed to reflow the material of the bumps 200 and the solder flux to physically bond the bumps 200 to the conductive lines 132 and the redistribution layer 174.

Figure 21:
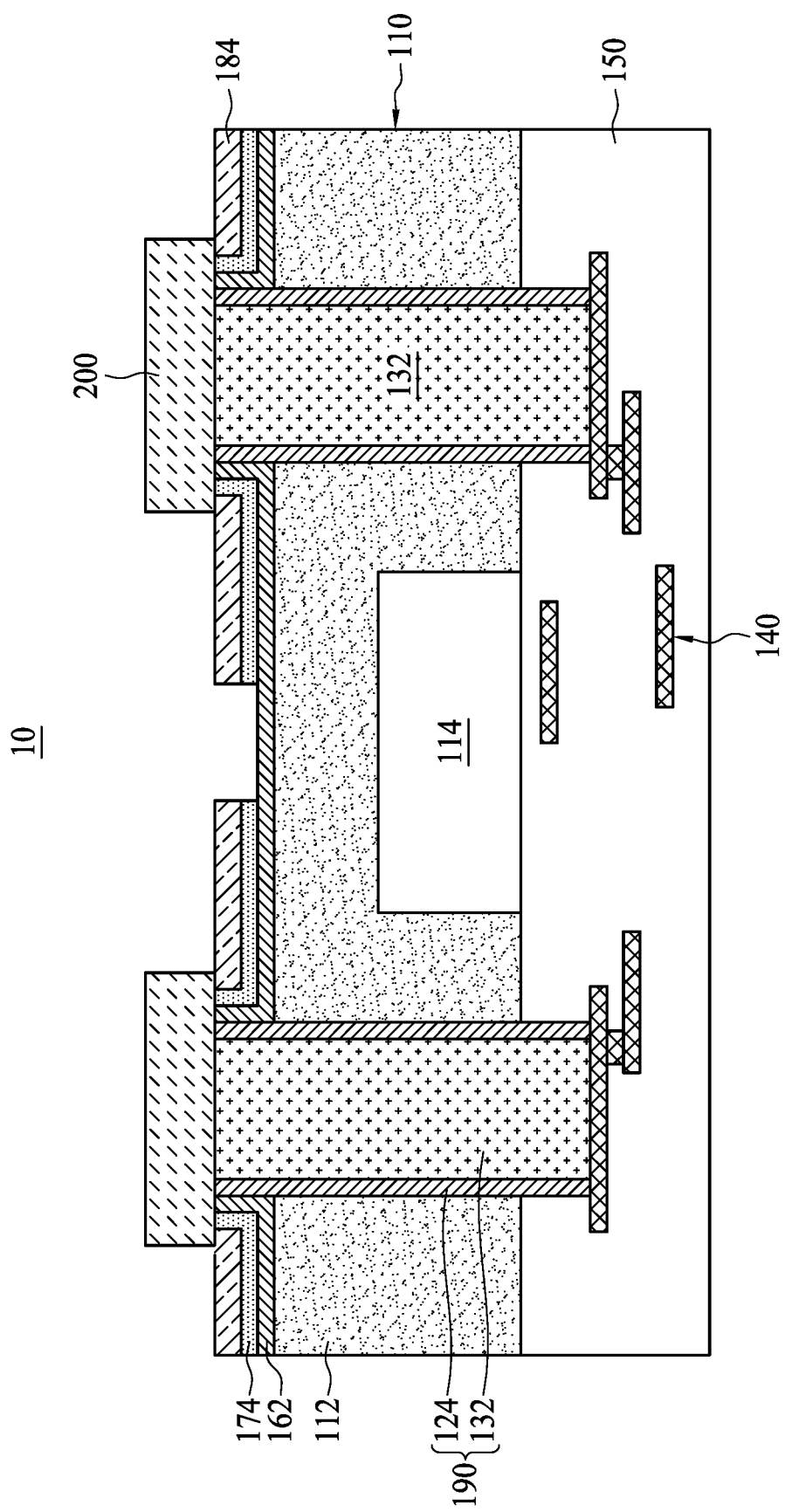

Referring to FIG. 21, an ashing process or a wet strip process may be used to remove the third photoresist mask 270, wherein the wet strip process may chemically alter the third photoresist mask 270 so that it no longer adheres to the dielectric layer 162, the redistribution layer 174 and the capping layer 184.

One aspect of the present disclosure provides a semiconductor device. The semiconductor device comprises a substrate, a conductive feature, a redistribution layer, at least one through silicon via, and at least one bump. The conductive feature is disposed over a front surface of the substrate. The redistribution layer is disposed over a back surface opposite to the front surface. The through silicon via penetrates through the substrate and contacts the conductive feature. The bump connects the redistribution layer to the through silicon via.

One aspect of the present disclosure provides a method of manufacturing a semiconductor device. The method includes steps of creating at least one trench in a semiconductor wafer; depositing an isolation film in the trench; depositing a conductive material on the isolation film to form at least one conductive line in the trench; forming a conductive feature, electrically coupled to the conductive line, over a front surface of the semiconductor wafer; thinning the semiconductor wafer until a back surface of the semiconductor wafer is below an end surface of the isolation film; forming a metallic layer over a periphery of the isolation film exposed through the semiconductor wafer and over a back surface opposite to the front surface; performing a grinding process to remove portions of the metallic layer and the isolation film until the conductive line is exposed; and forming at least one bump to connect the remaining metallic layer and the conductive line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate;
   a conductive feature disposed over a front surface of the substrate;
   a redistribution layer disposed over a back surface of the substrate opposite to the front surface thereof;
   at least one through silicon via penetrating through the substrate and contacting the conductive feature, wherein the through silicon via comprises a conductive line and an isolation liner enclosing the conductive line;
   at least one bump connecting the redistribution layer to the through silicon via; and
   a metallic layer formed over the back surface of the substrate and disposed over a portion of a periphery of the isolation liner exposed through the substrate, wherein the metallic layer has a removing portion being removed to expose the conductive line and a remaining portion connecting to the conductive line via the bump so as to form the redistribution layer;
   wherein the redistribution layer comprises a plurality of horizontal segments and a plurality of vertical segments connected to the horizontal segments and disposed over the periphery of the isolation liner, wherein the isolation liner separates the vertical segments of the redistribution layer from the conductive line.

2. The semiconductor device of claim 1, further comprising a dielectric layer disposed between the back surface of the substrate and the horizontal segments of the redistribution layer, and between the periphery of the isolation liner and the vertical segments of the redistribution layer.

3. The semiconductor device of claim 2, wherein portions of the dielectric layer are exposed through the horizontal segments of the redistribution layer.

4. The semiconductor device of claim 2, further comprising a capping layer covering the horizontal segments of the redistribution layer.

5. The semiconductor device of claim 4, wherein the capping layer has a thickness greater than thicknesses of the metallic layer and the dielectric layer.

6. The semiconductor device of claim 1, further comprising an insulative layer encasing the conductive feature, wherein the through silicon via extends into the insulative layer.

* * * * *